US006656661B2

(12) United States Patent
Hong et al.

(10) Patent No.: US 6,656,661 B2
(45) Date of Patent: Dec. 2, 2003

(54) WATERLESS IMAGEABLE ELEMENT WITH CROSSLINKED SILICONE LAYER

(75) Inventors: Suck-Ju Hong, Bronxville, NY (US); S. Peter Pappas, Juno Beach, FL (US)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 191 days.

(21) Appl. No.: 09/826,311

(22) Filed: Apr. 4, 2001

(65) Prior Publication Data

US 2002/0146634 A1 Oct. 10, 2002

(51) Int. Cl.⁷ .............................. G03F 7/023; G03F 7/38
(52) U.S. Cl. ................... 430/272.1; 430/162; 430/166; 430/273.1; 430/303; 524/264; 526/279
(58) Field of Search ............................. 430/303, 270.1, 430/273.1, 166, 162, 272.1; 528/10, 31, 32; 525/100; 524/264; 526/279

(56) References Cited

U.S. PATENT DOCUMENTS

| | | | |
|---|---|---|---|
| 3,419,593 A | * 12/1968 | Willing | ........................ 556/479 |
| 3,511,178 A | 5/1970 | Curtin | |
| 3,677,178 A | 7/1972 | Gipe | |
| 3,865,858 A | 2/1975 | Ossko et al. | |
| 3,894,873 A | 7/1975 | Kobayashi et al. | |
| 3,933,495 A | 1/1976 | Kondo et al. | |
| 4,189,323 A | 2/1980 | Buhr | |
| 4,239,850 A | 12/1980 | Kita et al. | |
| 4,342,820 A | 8/1982 | Kinashi et al. | |
| 4,350,753 A | 9/1982 | Shelnut et al. | |
| 4,358,522 A | 11/1982 | Fujita et al. | |
| 4,775,607 A | 10/1988 | Schlosser | |
| 4,842,988 A | 6/1989 | Herrmann et al. | |
| 4,842,990 A | 6/1989 | Herrmann et al. | |
| 4,853,313 A | 8/1989 | Mori et al. | |
| 5,232,813 A | 8/1993 | Okuno et al. | |
| 5,359,111 A | 10/1994 | Kleyer et al. | |
| 5,464,686 A | 11/1995 | Higashi et al. | |
| 5,503,074 A | 4/1996 | Hirano et al. | |
| 5,786,125 A | 7/1998 | Tsuchiya et al. | |
| 5,808,127 A | * 9/1998 | Nakagawa et al. | ......... 556/479 |
| 5,866,294 A | 2/1999 | Oguni et al. | |
| 5,888,696 A | 3/1999 | Hirano et al. | |
| 5,919,600 A | 7/1999 | Huang et al. | |
| 5,955,238 A | 9/1999 | Yokoya et al. | |
| 6,045,963 A | 4/2000 | Huang et al. | |
| 6,197,478 B1 | 3/2001 | Vermeersch et al. | |

FOREIGN PATENT DOCUMENTS

| | | |
|---|---|---|
| JP | 09-288348 | 11/1997 |
| JP | 09-288349 | 11/1997 |

OTHER PUBLICATIONS

Brochure entitled *Reactive Silicones* published by Gelest, Inc. (Morrisville, Pennsylvania), believed to have been published in 1999, 54 pages.

* cited by examiner

*Primary Examiner*—John S. Chu
(74) *Attorney, Agent, or Firm*—Faegre & Benson LLP

(57) ABSTRACT

The present invention includes an imageable element, which includes a sheet substrate, an imaging layer and a silicone layer, which comprises a crosslinked silicone polymer. The crosslinked silicone polymer is the curing product of a vinyl functional polysiloxane copolymer and a hydrosiloxane compound. The curing is catalyzed by a platinum carbonyl complex. Upon imagewise exposure and development, an imaged element is obtained, which is mounted on a dry printing press containing lithographic ink and used to produce printed stock.

47 Claims, No Drawings

WATERLESS IMAGEABLE ELEMENT WITH CROSSLINKED SILICONE LAYER

BACKGROUND OF THE INVENTION

1. Field of the Invention

The present invention relates to an imageable element, which can be imaged by analog or digital imaging and used in the preparation of negative or positive-working waterless lithographic printing plates. More particularly, the present invention relates to an imageable element, wherein the imaging layer is overcoated with a crosslinked silicone polymer which is the curing product of: a vinyl functional polysiloxane copolymer and a hydrosiloxane compound.

2. Description of the Prior Art

Waterless printing plates have existed since 1970. Most waterless printing plate precursors have an ink abhesive layer such as silicone overlying a light absorbing imaging layer. Imaging is typically achieved by exposing the imaging layer to an ultraviolet radiation source followed by selectively removing the ink abhesive coating. For positive working waterless plates, the imaging layer is a light absorbing layer typically containing a negative working diazo resin as disclosed in U.S. Pat. Nos. 3,511,178; 3,677,178; and 4,775,607; or a light absorbing layer containing a photopolymerizable compound as described in U.S. Pat. Nos. 3,894,873; 5,232,813, and 5,503,074. For negative working waterless plates, imaging has been achieved by solubilizing, via ultraviolet radiation, the imaging layer, which typically contains diazonaphthoquinones, as described in U.S. Pat. Nos. 4,342,820; 4,358,522 and 5,866,294. Solubilization has also been achieved by imagewise exposing a layer that undergoes light-induced acid-catalyzed hydrolysis as described in U.S. Pat. No. 4,842,990. U.S. Pat. No. 3,933,495 describes a dual-tone waterless plate wherein the solubility of the imaging layer is either enhanced or reduced by the developer in the developing step, depending upon developer used.

The printing plate precursors described above generally require a photographic film for imagewise exposure, corresponding to analog imaging. More recently, waterless plate precursors have been adapted for direct, imagewise exposure utilizing a computer-directed laser, corresponding to computer-to-plate, digital imaging. Typically, a material, which is capable of converting electromagnetic radiation into heat, known as a photothermal converter, is present in the radiation sensitive imaging layer. The photothermal converter is generally a pigment or a dye, which absorbs infrared radiation, and the imaging step is carried out using an infrared laser.

For negative working waterless plates, digital imaging has been achieved by solubilizing the imaging layer, which may contain a diazonaphthoquinone, as described in U.S. Pat. No. 5,919,600. Solubilization of the imaging layer has also been accomplished by overall, ultraviolet light-induced acid generation, followed by imagewise digital exposure, as described in U.S. Pat. No. 5,955,238. Digitally-imaged, negative working waterless plates have also been prepared by selectively reducing the adhesive forces between the imaging layer and the overlying silicone layer, as described in U.S. Pat. No. 5,888,696.

U.S. Pat. No. 5,786,125 describes a dual-tone waterless plate precursor for digital imaging. The imaging layer is solubilized by imagewise exposure with an infrared laser, followed by development. Alternatively, imagewise infrared exposure followed by overall heating prior to development, results in a positive-working printing plate. An alternative approach to positive-working digital plates has been the thermal insolubilization of the imaging layer by coalescence of polymer particles, as described in U.S. Pat. No. 6,197,478.

For both positive and negative working waterless plates prepared by either analog or digital imaging methods, the radiation sensitive layer is typically overcoated with an ink-repellant, crosslinked silicone rubber layer. The following two methods have generally been utilized for hardening the silicone rubber layer:

(1) Condensation reaction in which an organopolysiloxane having hydroxyl groups at both ends and/or along the polymer chain is crosslinked with a silane or siloxane having a hydrolyzable functional group directly bonded to the silicon atom thereof to give a silicone rubber; and (2) Addition reaction in which a polysiloxane having Si—H groups and a polysiloxane having —$CH_2$=CH— groups are crosslinked by hydrosilylation to give a silicone rubber.

U.S. Pat. No. 5,464,686 discloses that in cases of hardening by condensation, curing properties and adhesion to a radiation sensitive layer may change depending on the moisture content of the atmosphere during hardening. This would produce plates of variable sensitivity, making stable production very difficult. Because of this problem, it was concluded that hardening by addition reaction was superior because it did not involve such drawbacks. This patent describes positive working waterless plates having a silicone rubber layer crosslinked by an addition reaction utilizing platinum catalysts such as elemental platinum, platinum chloride, chloroplatinic acid and platinum coordinated with olefins. The commonly owned U.S. Pat. Nos. 5,919,600 and 6,045,963 also utilize platinum compounds to catalyze the addition reaction of a vinyl functional polysiloxane copolymer and a hydrosiloxane compound to form the crosslinked silicone polymer.

U.S. Pat. Nos. 4,842,988 and 4,842,990 disclose a silicic acid interlayer between the silicone and photosensitive layer to enhance adhesion. U.S. Pat. No. 4,842,988 includes radiation sensitive layers, which undergo both photosolubilization and photoinsolubilization. The radiation sensitive layers in U.S. Pat. No. 4,842,990 undergo photosolubilization. This approach of enhancing adhesion by providing a silicic acid interlayer requires the additional step of applying the interlayer and thus, adds to the manufacturing cost.

The above references point out the importance of adhesion of the crosslinked silicone rubber layer to the radiation-sensitive layer, which is generally regarded as one of the most important factors determining press life of waterless plates. Furthermore, the method of crosslinking the silicone rubber layer is recognized as an important contributing factor to the adhesion as well as to the durability of the adhesive forces.

Platinum carbonyl catalysts have been used in hydrosilylation reactions. For example, U.S. Pat. No. 3,865,858 discloses dichloroplatinum dicarbonyl as a hydrosilylation catalyst for the production of organosilicone compounds. U.S. Pat. No. 5,359,111 discloses methods of controlling the rate of hydrosilylation in reaction mixtures, methods for isomerization and methods for producing cyclosiloxanes, in which dichloroplatinum dicarbonyl, as well as other platinum catalysts, are utilized. However, none of the above references discloses the use of platinum carbonyl catalysts for crosslinking vinyl functional polysiloxanes with hydrosiloxanes. Furthermore, none of the above references discloses the use of platinum carbonyl catalysts to improve interlayer adhesion.

SUMMARY OF THE INVENTION

It is an object of the present invention to provide a radiation sensitive waterless plate having a highly durable crosslinked silicone polymer, which exhibits superior adhesion to the radiation sensitive imaging layer, high resistance to delamination under humid conditions, high durability and long press life. As a result of extensive studies, it has now been found that these objectives can be accomplished with vinyl-functional siloxane polymers that are crosslinked with hydrosiloxanes by a catalyzed hydrosilylation reaction in which a platinum carbonyl complex is utilized as the addition catalyst.

Accordingly, the present invention includes an imageable element comprising a sheet substrate, an imaging layer and a silicone layer. The imaging layer is a radiation-sensitive imaging layer. The silicone layer comprises a crosslinked silicone polymer which is the curing product of a vinyl functional polysiloxane copolymer having a molecular weight of at least 1,000 g/mol and a hydrosiloxane compound. The curing is catalyzed by a platinum compound having at least one carbonyl ligand and at least one non-carbonyl ligand. The non-carbonyl ligand can be a halogen, a phosphine, an ethylenically unsaturated compound or a combination thereof.

The present invention further includes a method of producing an imageable element. The method comprises the steps of applying onto a surface of a sheet substrate an imaging layer and applying onto said imaging layer a silicone layer comprising a crosslinked silicone polymer. The crosslinked silicone polymer is the curing product of a vinyl functional polysiloxane copolymer having a molecular weight of at least 1,000 g/mol and a hydrosiloxane compound. The curing is catalyzed by a platinum compound having at least one carbonyl ligand and at least one non-carbonyl ligand.

The present invention still further includes a method of producing an imaged element comprising the steps of:

- providing an imageable element comprising a sheet substrate, an imaging layer and a silicone layer comprising a crosslinked silicone polymer which is the curing product of a vinyl functional polysiloxane copolymer having a molecular weight of at least 1,000 g/mol and a hydrosiloxane compound, wherein the curing is catalyzed by a platinum compound having at least one carbonyl ligand and at least one non-carbonyl ligand;
- imagewise exposing said imaging layer to radiation to form an imaged layer having exposed areas and complimentary unexposed areas; and
- applying said developer liquid to said imageable element to produce an imaged element having ink receptive areas and complimentary ink repellent areas of said silicone layer.

The present invention further includes a crosslinked silicone polymer which is the curing product of a vinyl functional polysiloxane copolymer having a molecular weight of at least 1,000 g/mol and a hydrosiloxane compound. The curing is catalyzed by a platinum compound having at least one carbonyl ligand and at least one non-carbonyl ligand.

The method of producing the imaged element can be used to produce negative or positive-working waterless printing plates according to the present invention.

The platinum carbonyl catalyst provides the advantage of producing a highly durable silicone layer having superior adhesion to the underlying imaging layer, in particular, to resisting delamination in humid environments.

The imageable waterless plate in which the non-image (i.e. background) area is a highly durable crosslinked silicone polymer according to the present invention exhibits superior adhesion to the imaging layer, including high resistance to delamination under humid conditions.

The negative or positive-working waterless printing plate of the present invention, with high molecular weight silicone gum and imaging layer with s-triazine, has the advantage of providing long run printing, solvent resistance, and less Ink toning at high temperature on the press using water washable alkaline waterless and acidic waterless inks. As a result, the silicone layers of the present invention are highly durable resulting in long press life.

DETAILED DESCRIPTION OF THE INVENTION

A negative or positive-working, waterless, planographic printing plate is one, which can be used in lithographic printing without requiring dampening with water.

A typical plate of this type includes (1) a silicone layer, (2) a negative or positive-working imaging layer, e.g., a photosolubilizable or thermally solubilizable layer, and (3) a substrate.

After imagewise exposure to radiation, a developer is applied to produce an imaged element having ink receptive areas and complementary ink repellent areas. In the case of a negative-working plate precursor, the developer removes the silicone layer corresponding to the imagewise exposed areas. The imaging layer underlying the silicone layer in the exposed areas may also be removed from the ink receptive surface. The coatings in areas not exposed to radiation remain intact and form the ink-repelling areas of the plate. Typically, the radiation used is ultraviolet (UV) radiation for analog imaging and infrared radiation for digital imaging.

In one embodiment, the present invention includes an imageable element comprising a sheet substrate, an imaging layer and a silicone layer comprising a crosslinked silicone polymer which is the curing product of: a vinyl functional polysiloxane copolymer having a molecular weight of at least 1,000 g/mol and a hydrosiloxane compound, wherein the curing is catalyzed by a platinum compound having at least one carbonyl ligand and at least one non-carbonyl ligand. The non-carbonyl ligand can be a halogen, a phosphine, an ethylenically unsaturated compound or a combination thereof.

Preferably, the ethylenically unsaturated compound is an ethylenically unsaturated silicon compound, such as, a cyclic vinylsiloxane, a non-cyclic vinylsiloxane or a combination thereof, including 1,3-divinyl-1,1,3,3-tetramethyldisiloxane, 1,3,5-trimethyl-1,3,5-trivinyl-cyclotrisiloxane, 1,3,5,7-tetramethyl-1,3,5,7-tetravinyl-cyclotetrasiloxane and a combination thereof. The platinum catalyst can be platinum(0)-carbonyl-1,3,5,7-tetramethyl-1,3,5,7-tetravinylcyclotetrasiloxane complex, dichloroplatinum(II) dicarbonyl or a combination thereof.

The crosslinked silicone polymer of this embodiment is prepared by any suitable method that uses a platinum carbonyl compound as a catalyst. As before, the polysiloxane network is formed by the addition of hydrosiloxane compound to alkenyl groups of a vinyl functional polysiloxane copolymer, i.e., crosslinking by an addition reaction.

The vinyl functional polysiloxane copolymer precursor has a molecular weight of at least 1,000, preferably at least 400,000 g/mol, more preferably at least 500,000 g/mol.

Depending on desired properties, the molecular weight can be from about 1000 to about 2,000,000 g/mol.

The crosslinked silicone polymer in the imageable element of the present invention is the curing product of a vinyl functional polysiloxane copolymer and a hydrosiloxane compound, prepared using a platinum carbonyl compound as a catalyst.

The crosslinked silicone polymer can be prepared by an addition reaction between vinyl functional polysiloxane copolymer and a hydrosiloxane compound. A hydrosiloxane homopolymer or copolymer in the presence of a suitable platinum carbonyl compound catalyst can add to the alkenyl groups of the vinyl functional polysiloxane to produce the crosslinked silicone polymer. The alkenyl groups in the siloxane polymer may be randomly distributed along the polymer chain, or located at the chain ends. The hydrosiloxane compound can be a methylhydrosiloxane homopolymer or copolymer, such as SL6020, which is a hydromethyl siloxane polymer, a product of GE Silicones.

The silicone rubber layer used in the present invention, which is crosslinked through the addition reaction between Si—H and —CH=CH— groups, can be obtained through the reaction of a polyvalent hydrogen organopolysiloxane with a polysiloxane having at least two —CH=CH— groups in the molecule and desirably those obtained by crosslinking the composition comprising the following components: (a) 100 parts by weight of an organopolysiloxane carrying at least two alkenyl groups (preferably vinyl groups) in the molecule, which are directly bonded to the silicon atom; (b) 0.1 to 1,000 parts by weight of a hydrogen organopolysiloxane having at least two Si—H bonds in the molecule; and (c) 0.00001 to 10 parts by weight of a catalyst for the addition reaction.

The alkenyl groups of component (a) may be present either at the ends of the molecular chain or in the middle thereof. Component (a) may also have organic groups other than alkenyl groups, which can be substituted or unsubstituted alkyl and aryl groups. Component (a) may comprise a small amount of hydroxyl group. The vinyl functional polysiloxane copolymer precursor used in the present invention preferably has a molecular weight of at least 1,000, preferably at least 400,000 g/mol, more preferably at least 500,000 g/mol. Depending upon desired properties, the molecular weight can be from about 1,000 to as high as about 2,000,000 g/mol.

Component (b) forms a silicone rubber layer through the reaction with component (a) and further serves to impart adhesion to the imaging layer. The hydrogen atom of component (b) may be present either at the ends of the molecular chain or in the middle thereof. Component (b) may also have organic groups other than hydrogen atoms, which may be selected from the same groups as those listed above in connection with component (a). It is preferred that not less than 60% of the total number of organic groups of components (a) and (b) be methyl groups from the viewpoint of the ink repellency. The molecular structures of components (a) and (b) may be linear, cyclic or branched ones and the molecular weight of at least one of them exceeds 1,000 while taking physical properties of the resulting rubber into consideration. Further it is rather preferred that the molecular weight of component (a) exceeds 1,000.

Examples of component (a) include alpha, omega-divinyl-polydimethylsiloxane and (methylvinylsiloxane) (dimethylsiloxane) copolymer having methyl groups at both ends. Examples of component (b) include polydimethylsiloxane having hydrogen atoms at both ends, alpha, omega-dimethylpolymethyl hydrogen siloxane, dimethyl hydrogen siloxane) (dimethylsiloxane) copolymer having methyl groups at both ends and cyclic polymethyl hydrogen siloxane.

Examples of platinum compounds, i.e., component (c), that are useful in the present invention include platinum complexes having at least one carbonyl ligand and at least one non-carbonyl ligand. The ligand can be a halogen, a phosphine, an ethylenically unsaturated compound or a combination thereof.

The preferred catalyst of the present invention is a platinum carbonyl complex in which the platinum carbonyl is further complexed with a methylvinyl cyclosiloxane or with a halogen. Particularly preferred are platinum(0)-carbonyl-1,3,5,7-tetramethyl-1,3,5,7-tetravinylcyclotetrasiloxane complex and dichloroplatinum(II) dicarbonyl. An example of such a platinum carbonyl compound is SIP 6829, available from Gelest.

This catalyst is used to prepare a crosslinked silicone polymer by a process, which includes contacting a vinyl functional polysiloxane copolymer and a hydrosiloxane compound. The curing, which is catalyzed by a platinum carbonyl compound according to the present invention, is carried out at a temperature and a period of time sufficient to produce a crosslinked silicone polymer.

The sensitivity of platinum catalysts to poisoning is a well-known characteristic. Based on the superior results obtained with platinum carbonyl catalysts of the present invention, it appears that such platinum carbonyl catalysts are resistant to poisoning. Following application, resistance of the platinum catalyst to poisoning is expected to promote crosslinking, thereby increasing the durability of the printing plate precursor during processing and storage. Such resistance against poisoning is also expected to increase the durability of the exposed and developed printing plate, resulting in longer press life and greater toning resistance of the non-image area.

When the foregoing three components, i.e., components (a), (b) and (c), are admixed, the composition undergoes an addition reaction and the hardening thereof is initiated. However, it should be noted that the hardening rate of the composition increases as the reaction temperature is raised. For this reason, it may be necessary to extend the pot life, or the time extending from the preparation thereof till it is converted to crosslinked rubber. The composition is preferably hardened in a temperature range which does not affect the properties of the substrate and the imageable resin layer and is preferably maintained at a high temperature until it is completely hardened in order to achieve stable adhesion to the imageable resin layer.

The platinum ligands serve to extend the pot life of the three component composition. To further improve the pot-life, volatile inhibitors can be used, including compounds, such as, ketones, alcohols, alkynes and cyclic silicon compounds, i.e., cyclic silanes and siloxanes. For example, the pot-life can be significantly increased by addition of the volatile inhibitor 1,3,5,7-tetramethyl-1,3,5,7-tetravinylcyclotetrasiloxane, i.e., SIT 7900 inhibitor, also available from Gelest.

In addition to the foregoing components, the composition may optionally comprise a known adhesion promoter, such as, an alkenyltrialkoxysilane, as well as a known additive, such as, silica for enhancing the strength of the resulting rubber.

A silicone layer, prepared according to the present invention, can be employed in waterless plates together with known examples of imaging layers. The imaging layer can become more soluble upon irradiation to provide a negative working imageable element or it can become less soluble upon irradiation thereby providing a positive working imageable element. Also, the imaging layer can exhibit increased adhesion to the silicone layer upon irradiation to provide a positive working imageable element or it can exhibit decreased adhesion to said silicone layer upon irradiation to provide a negative working imageable element. Furthermore, the imageable element can be exposed by analog or digital methods.

Examples of negative-working, waterless plates, which can be imagewise exposed by analog methods, are provided in U.S. Pat. No. 6,045,963.

In a preferred embodiment of the present invention, the imagable layer comprises a diazido naphthoquinone ester or amide compound and can further comprise a thermoplastic polyurethane having an allyl functionality. As used herein the term "thermoplastic" is intended to mean a polymer or resin which is substantially free of polymeric networks formed by crosslinking. The thermoplastic polyurethane can be prepared by reacting a diol and one or more diisocyanate.

Any suitable aromatic or aliphatic diisocynates can be used, with aromatic diisocynates being preferred. Suitable diisocyanates include 2,4-tolylene diisocyanate, 2,6-tolylene diisocyanate, p-xylene diisocynate, mxylene diisocyanate, 4,4'-diphenylmethane diisocyanate, 1,5-naphthalene diisocyanate, 3,3'-dimethylbiphenyl-4,4'-diisocyanate, hexamethylene diisocyanate, trimethylhexamethylene diisocyanate, isophorone diisocyanate, 4-4'-methylenebis (cyclohexyl isocyanate), methylcyclohexane-2,4-diisocyanate, methylcyclohexane-2,6-diisocyanate and 1,3-bis(isocyanatomethyl) cyclohexane. A combination of the same can also be used.

The diol can be one or more of the following: 3-allyloxy-1,2-propanediol, ethylene glycol, polyethylene glycol, propylene glycol, polypropylene glycol and neopentyl glycol. Preferably, 70% or more of the diol is a diol, such as, 3-allyloxypropane-1,2-diol, which contains an allyl functionality. If a mixture of different diols is used, at least one of the diols in the mixtures should contain an allyl group. A simple and commercially available diol with an allyl group is 3-allyloxy-1,2-propanediol.

Other suitable diols that can be used with allyl-diols include ethylene glycol, polyethylene glycol, propylene glycol, polypropylene glycol, and neopentyl glycol. Preferably the ally functional diol constitutes more than 70%, and more preferably more than 90% of the diol mixture.

The diazido naphthaquinone ester or amide compound in the imaging layer is preferably a diazido naphthoquinone sulfonate of a phenolic material, such as, a novolac resin or an acetone and pyrogallol condensate. In addition to these, ancillary phenolic resins can also be used.

Examples of 1,2-diazido-naphthaquinone compounds that may be used in this invention include the o-naphthoquinone diazide compounds such as those disclosed in U.S. Pat. Nos. 2,766,118; 2,767,092; 2,772,972; 2,859,112; 2,907665; 3,046,111; 3,046,115; 3,046,118; 3,046,119; 3,046,121; 3,046,122; 3,046,123; 3,061,430; 3,102,809; 3,106,465; 3,635,709; and 3,647,443. Among these, the preferred are o-naphthoquinone-diazidosulfonates or o-naphthoquinone-diazidocarboxylates of aromatic hydroxyl compounds; o-naphthoquinonediazido-sulfonic acid amides or o-naphthoquinone-diazidocarboxylic acid amides of aromatic amine compounds, for example, esters of naphthoquinone-1,2-diazido-sulfonic acid with polyhydroxyl phenyl; esters of naphthoquinone-1,2-diazido-4-sulfonic acid or naphthoquinone-1,2-diazido-5-sulfonic acid with pyrogallol/acetone resins; esters of naphthoquinone-1,2-diazidosulfonic acid with novolac type phenol/formaldehyde resins or novolac type cresol/formaldehyde resins; amides of poly(p-aminostyrene) and naphthoquinone-1,2-diazido-4-sulfonic acid or naphthoquinone-1,2-diazido-5-sulfonic acid; esters of poly (p-hyd roxystyrene) and naphthoquinone-1,2-diazido-5-sulfonic acid and the like.

Preferably the 1,2-diazido-naphthaquinone compound is a 1,2-diazido-naphthaquinone sulfonate of a phenolic material. Typically such sulfonate derivatives are the reaction product of the phenolic material with one or more of 1,2-diazido-naphthaquinone-4-sulfonyl chloride or with one or more of 1,2-diazido-naphthaquinone-5-sulfonyl chloride.

The phenolic material is an aromatic compound or resin bearing a plurality of phenolic hydroxy groups. Useful phenolic materials of this type include novolac resins and the condensates of acetone with pyrogallol.

A preferred example of 1,2-diazidonaphthaquinone compound is RP2, which is the reaction product between a novolac resin and 1,2-diazidonaphthaquinone-4-sulfonyl chloride, and is commercially available from PCAS, France.

The polyuretharie and 1,2-diazidonaphthaquinone compound, along with any optional ingredients, may be dissolved in a suitable solvent system for film casting. The solvent system may contain one or more of the following common organic solvents: 2-butanone, methanol, ethanol, 1-propanol, 2-propanol, 1-butanol, methyl isobutyl ketone, propylene glycol methyl ether, ethylene glycol methyl ether, ethylene glycol ethyl ether, toluene and xylenes.

Examples of related, negative-working, digitally-imaged, printing plate precursors, in which the imaging layer comprises a diazido naphthoquinone ester or amide, are disclosed in U.S. Pat. No. 5,919,600, the contents of which are incorporated herein by reference. Preferably, the imaging layers include an infrared absorbing material, which is capable of converting the absorbed infrared radiation into thermal energy; and the plate precursors are imagewise exposed with an infrared laser. Subsequent, development results in removal of the imagewise exposed regions of both the imaging layer and the overlying silicone layer.

Selective solubilization of the imagewise exposed regions can also be accomplished utilizing imaging layers, which comprise a polymer or compound that is decomposed by acid and an acid precursor that can be activated by radiation. Such photoactivated compositions are described in U.S. Pat. No. 4,842,990, the contents of which are incorporated herein by reference. Such compositions can also be adapted for digital imaging by including a photothermal converter, as described in U.S. Pat. No. 5,955,238, the contents of which are incorporated herein by reference.

Other compositions known in the art can also be used as the imaging layer in the imageable element of the present invention. For example, a silicone layer prepared according to the present invention can be employed in waterless plates together with an imaging layer, which undergoes photoinsolubilization. Such imageable compositions that undergo photoinsolubilization include photopolymerizable compositions and photocrosslinkable compositions.

Photopolymerizable compositions generally utilize ethylenically unsaturated monomers and oligomers, such as, acrylated and/or methacrylated resins, together with photoinitiator systems for free radical polymerization.

Photocrosslinkable compositions include polymers with undergo photocycloaddition, such as polymers having cinnamate groups, chalcone groups and dimethyl maleimide groups, in the presence of photosensitizers. Photocrosslinkable compositions also include diazonium salt condensates or bis-azido compounds together with crosslinkable binders. Several of these approaches, including hybrid compositions, which undergo photoinsolubilization that include polymerizable ethylenically-unsaturated monomers together with appropriate photoinitiators, as well as diazonium salt condensates, are disclosed in U.S. Pat. Nos. 4,842,988 and 5,464,686, the contents of which are incorporated herein by reference.

A silicone layer prepared according to the present invention can also be employed together with an imaging layer, which undergoes insolubilization by thermally-induced coalescence of polymer particles, as disclosed in U.S. Pat. No. 6,197,478, the contents of which are incorporated herein by reference. Such digitally-imaged, positive-working elements preferably include a photothermal converter and. are imagewise exposed with an infrared laser, following which development results in selective removal of both the imaging layer and the overlying silicone layer in the unexposed regions.

A silicone layer prepared according to the present invention can also be employed together with an imaging layer, which comprises an acid-catalyzed crosslinkable composition and an acid precursor, which is photo or thermally activated. In such compositions, the acid precursor may also function as a solubility inhibitor, in which case, dual tone compositions are possible. Such digitally-imaged dual tone compositions, which include a photothermal converter, are disclosed in U.S. Pat. No. 5,786,124, the contents of which are incorporated herein by reference. Imagewise exposure with infrared radiation followed by heating results in insolubilization of the imaging layer by crosslinking, in which case, development results in selective removal of both the imaging layer and the overlying silicone layer in the unexposed regions. However, imagewise exposure followed by development, without the intermediate heating step, results in solubilization of the imaging layer, in which case, development results in selective removal of both the imaging layer and the overlying silicone layer in the exposed regions.

Other waterless plates systems known in the art can also be used as the imaging layer in the imageable element of the present invention. For example, waterless plates in which exposure of the imaging layer results in a decrease in adhesion between the imaging layer and the silicone layer. In this case, only the silicone layer is removed in the exposed areas. Such negative working waterless plates, based on photoinduced reduction in adhesion, such as those having photoreleasing imaging layers which include naphthoquinone diazides in a crosslinked polyurethane matrix, are disclosed, for example, in U.S. Pat. No. 4,342,820, the contents of which are incorporated herein by reference. Such digitally-imaged, negative working waterless plates, based on thermally induced reduction in adhesion, are disclosed in U.S. Pat. No. 5,888,696, the contents of which are incorporated herein by reference.

Alternative systems in which exposure to radiation may result in an increase in adhesion between the imaging layer and the silicone layer can also be used. The photoadhesive layers include acrylated and methacrylated monomers and oligomers together with a photoinitiator for free radical polymerization. In this case, only the silicone layer is removed from the unexposed regions, which corresponds to a positive working plate. Such positive working waterless plates, based on a photoinduced increase in adhesion, are described, for example, in U.S. Pat. No. 3,894,873, the contents of which are incorporated herein by reference.

The imagable layer may be applied using the application methods known in the art. After proper drying, the coating weight of the imaging layer preferably is in the range of about 0.2 to about 5.0 g/m$^2$, and more preferably in the range from about 0.7 to about 2.5 g/m$^2$.

UV and visible laser imaging may also be used together with an appropriate photothermal converter. Accordingly, the imageable composition of the present invention can further comprise a photothermal converter material, i.e., a material that is capable of converting electromagnetic and infrared radiation into heat.

The sheet substrate in the imageable element is typically an aluminum sheet. However, other materials that are commonly known to those skilled in the art can also be used. Suitable substrates include any sheet material conventionally used to prepare lithographic printing plates, including metals such as aluminum sheets; paper; paper coated on one or both sides with an .alpha.-olefin polymer such as polyethylene; films such as cellulose acetate film, polyvinyl acetal film, polystyrene film polypropylene film, polyester film such as polyethylene terephthalate film, polyamide film, polyimide film, nitrocellulose film, polycarbonate film, polyvinylchloride film; composite films such as polyester, polypropylene or polystyrene film coated with polyethylene film; metallized paper or films; metal/paper laminates and the like. The surface of plastic films may be treated using the surface treatment techniques known in the art to improve adhesion between the substrate and organic coatings.

A preferred substrate is an aluminum sheet. The surface of the aluminum sheet may be treated with metal finishing techniques known in the art including brushing roughening, electrochemical roughening, chemical roughening, anodizing, and silicate sealing and the like. If the surface is roughened, the average roughness (Ra) is preferably in the range from 0.1 to 0.8 µm, and more preferably in the range from about 0.1 to about 0.4 µm. The preferred thickness of the aluminum sheet is in the range from about 0.005 inch to about 0.20 inch.

The silicone rubber layer used in the present invention serves as an ink repellent layer. Therefore, if the thickness thereof is too small, the ink repellency thereof is reduced and the layer is liable to be damaged. On the other hand, if it is too large, the developability thereof is impaired. Accordingly, the thickness thereof desirably ranges from 0.5 to 5 g/m$^2$ and preferably 1 to 3 g/m$^2$ (weighed after drying).

The silicone rubber layer prepared by addition reaction used in the invention is relatively slightly influenced by humidity and further it can be crosslinked rapidly. Therefore, rubber layers having uniform physical properties can easily be obtained. On the other hand, if a condensed silicone rubber layer is used and the imaging layer comprises carboxylic acid, the silicone rubber layer is often insufficiently hardened depending on the kinds of the crosslinking agents used. However, the silicone rubber layer can sufficiently be hardened even if carboxylic acids are present in the imaging layer. Therefore, the use of the addition type silicone rubber layer makes it possible to use an imaging layer comprising carboxylic acids. This in turn leads to the formation of an imageable plate, which can be developed with a developer comprising mainly of water or alkaline water and thus the imageable plate can easily be designed.

The imageable plate may further comprise various kinds of silicone rubber layers applied onto the foregoing silicone rubber layer or an adhesive layer between the imaging layer and the silicone rubber layer for enhancing the interlayer adhesion or for suppressing a poisoning effect of the catalyst present in the silicone rubber layer.

An optional protective layer may be laminated on top of the silicone layer to protect the silicone surface during storage and handling. The protective layer may be applied onto the surface of the silicone rubber layer. The protective layer may be formed by laminating the silicone rubber layer with a transparent film such as a polyethylene, polypropylene, polyvinyl chloride, polyvinylidene chloride, polyvinyl alcohol, polyethylene terephthalate or cellophane film or by coating the silicone rubber layer with a polymer. These films may be used in the oriented form. In addition, these films may be matted for ensuring the adhesion to an original in a printing frame during imagewise exposure to light. Typically, the protective layer is a thin polymeric film that can be easily removed without damaging the silicone layer surface either prior to or during processing and preferably includes polyesters such as polyethylene terephthalate, polyolefins such as polyethylene and polypropylene, and the like.

An optional primer layer may be inserted between the imaging layer and the substrate. The primer layer may perform one or several functions including ink-receptivity during printing, dye receptivity if the developed plate needs to be dyed to enhance visual image contrast, and adhesion promotion.

The primer layer may be a thermoset coating or it can be a UV curable coating. It may also be a thermoplastic coating provided that the primer coating is not soluble in the application solvents used in casting the imaging layer. Examples of thermoset coatings include polyester-melamine coatings, acrylic-melamine coatings, epoxy coatings, and polyisocyanate coatings. An example of a thermoplastic coating is polyvinyl alcohol. UV curable coatings can be free radical polymerizable coatings, cationic crosslinkable coatings catalyzed by a photogenerated acid or it can be a diazo resin with suitable binders.

The silicone layer can further comprise an adhesion promoter, such as, aminosilanes. The use of such an adhesion promoter is optional. The optional adhesion promotion layer may be inserted between the silicone top layer and the imageable sublayer. Specific examples of such aminosilanes include 3-aminopropyl triethoxysilane and 3-(N-(2-aminoethyl)amino)propyl trimethoxy silane.

Ancillary ingredients that may be added to the imaging layer include colorants, leuco dyes, surfactants and acid generators. Such ancillary ingredients are useful for adjusting coating appearances, for quality control during plate manufacturing and for image inspections before and after development. The imaging layer may also contain an ancillary co-binder such as a phenolic resin, to enhance developability in some developer solutions.

The present invention also includes a method of producing an imageable element. The method includes the steps of coating an imaging layer on a surface of a sheet substrate and thereafter coating on the imaging layer a silicone layer. The silicone layer includes a crosslinked silicone polymer, which is the curing product of a vinyl functional polysiloxane copolymer and a hydrosiloxane compound.

Preferably, the silicone layer is obtained by coating a vinyl functional polysiloxane copolymer and a hydrosiloxane compound on the imaging layer and curing in the presence of a curing catalyst, such as a platinum carbonyl complex, to produce the crosslinked silicone polymer.

The present invention also includes a method of producing an imaged element. The method includes imagewise exposing the imageable element according to the present invention to radiation.

The imagewise exposure forms an imaged element having exposed areas and complimentary unexposed areas. Thereafter, a developer liquid is applied to the imageable element to produce an imaged element having ink receptive areas and complimentary ink repellent areas of the silicone layer. Preferably, the exposure radiation is electromagnetic radiation, such as, ultraviolet radiation, or infrared radiation. Alternatively, the imageable element of the present invention can be imaged using a conventional apparatus containing a thermal printing head or any other means for imagewise conductively heating the imageable composition, such as with a heated stylus or with a heated stamp.

Following imagewise exposure by analog or digital means, the exposed plate precursor is then developed with a developer capable of selectively removing the silicone rubber layer in the exposed or unexposed regions, depending upon the function of the imaging layer. In those regions from which the silicone layer is removed, the underlying imaging layer may also be removed totally or in part.

The developer used in the present invention can be any of those known as developers for imageable plate precursors that require no dampening water. Preferred examples thereof include aliphatic hydrocarbons, such as, hexane, heptane, "Isopar E, H, G" (trade names of aliphatic hydrocarbons available from ExxonMobil Chemical Company), gasoline and kerosene; aromatic hydrocarbons, such as, toluene and xylene; halogenated hydrocarbons, such as, trichlene to which the following polar solvents are added or the polar solvents per se: alcohols such as methanol, ethanol, propanol, benzyl alcohol, ethylene glycol monophenyl ether, 2-methoxyethanol, 2-ethoxyethanol, carbitol monoethyl ether, carbitol monomethyl ether, triethylene glycol monoethyl ether, propylene glycol monomethyl ether, propylene glycol monoethyl ether, dipropylene glycol monomethyl ether, polyethylene glycol monomethyl ether, propylene glycol, polypropylene glycol, triethylene glycol and tetraethylene glycol; ketones, such as, acetone and methyl ethyl ketone; esters, such as, ethyl acetate, methyl lactate, ethyl lactate, butyl lactate, propylene glycol monomethyl ether acetate, carbitol acetate, dimethyl phthalate and diethyl phthalate; and other polar solvents such as triethyl phosphate and tricresyl phosphate.

In addition, it is also possible to use, as developers, those obtained by adding water to the foregoing developers mainly comprising organic solvents; the foregoing organic solvents solubilized in water by the use of a solubilizing agent, such as, a surfactant; these developers which further comprise an alkaline agent, such as, monoethanolamine, diethanolamine, triethanolamine, sodium carbonate, sodium silicate, potassium silicate, sodium hydroxide, potassium hydroxide or sodium borate; or tap water per se or an alkaline water.

The development can be performed by any known manner, for instance, by rubbing the plate surface with a developing pad containing the foregoing developer or by pouring the developer on the plate surface and then rubbing the surface with a developing brush in water. Thus, if the silicone rubber layer and the imaging layer on the image area are removed, the surface of the substrate or the primer layer is correspondingly exposed and serves as an ink receiving portion. Alternatively, if only the silicone rubber layer on the image area is removed, the imaging layer is thus exposed and serves as an ink receiving portion.

The imagewise exposed imageable plate of the present invention can also be developed by a method comprising the steps of dissolving out a part or whole of the imaging layer on the image area with a developer capable of dissolving at least part of the imaging layer on the image area and then rubbing the plate surface in the presence of water or a solvent mainly comprising water, which does not swell the silicone rubber layer, to remove the silicone rubber layer on the image area. In this case, the development can be performed using an automatic developing machine for carrying out this method.

The developer can comprise a dye so that the exposed image portion (light-sensitive layer) can be dyed for the purpose of confirming the image-forming properties of the imageable plate thus obtained or for the purpose of the plate examination. If the developer used does not comprise any dye for dyeing the exposed image portion, the imageable plate can be treated with a dyeing solution after the development. The image portion is lightly rubbed with a soft pad containing the dyeing solution to thus dye only the exposed portion of the imaging layer and thus it can be confirmed whether even the highlight portion is sufficiently developed or not. The dyeing solutions used are, for instance, those obtained by dissolving or dispersing at least one dye selected from the group consisting of disperse dyes, acid dyes and basic dyes in a solvent such as water, alcohols, ketones, ethers or mixture thereof. It is also effective to add, to the dyeing solution, carboxylic acids, amines, surfactants and/or dyeing aids for improving the dyeing ability of the solution.

Preferably, the developer liquid includes a propylene glycol ether, such as, tripropylene glycol n-butyl ether. The developer liquid can be diluted with a non-developing liquid, such as, an alcohol, glycol, aliphatic hydrocarbon and a combination thereof. As used herein, the term non-developing liquid is intended to mean any liquid, which does not penetrate the silicone layer and/or does not selectively dissolve or disperse the photoreaction products.

The imaged element prepared according to the method described above can be mounted on a dry printing press for use as a waterless printing plate.

The present invention is further described in the following examples, which are intended to be illustrative and not limiting.

EXAMPLE 1

The imaging layer forming solution was prepared as follows: Five parts of polyurethane resin powder (UR 4240-Panchim, which is an allyl functional polyurethane derived from monoallylglycerol and 4,4'-methylene-bis-(phenylisocyanate)), 1.5 parts of naphthoquinone-1,2-diazide-4-sulfonate of p-cresol formaldehyde resin (Posilux 2402-PCAS) and 0.1 parts of ethyl violet (basic violet 4, from Aldrich Chemical) were dissolved in a mixture of 150 parts 1-methoxy-2-propanol and 7 parts of ethanol (parts by weight). The resulting solution was applied onto brush grained aluminum base substrate by a spin-coated to give a coat weight of 1.0 g/m² after drying at 130° C. for one minute to form an imaging layer.

EXAMPLE 2

A silicone rubber solution for forming an ink repellent silicone rubber layer was prepared as follows: into 190 parts of Isopar E (Isoparaffin solvent from Exxon Chemical), 9.9 parts of silicone gum VGM-021 (polydimethyl siloxane-methyl vinyl siloxane copolymer of molecular weight of 500,000 from Gelest), 0.1 parts of SIT 7900 inhibitor (1,3,5,7-tetravinyl-1,3,5,7-tetramethylcyclotetrasiloxane, from Gelest), 0.35 parts of SL-6020 (methyl hydrogen polysiloxane, from General Electric), and 0.17 parts of SIP 6829 (platinum carbonyl catalyst from Gelest) were dissolved. The resulting silicone rubber solution was applied by spin coating onto the imaging layer of Example 1 above, and was followed by heating for two minutes at 130° C. to cure and form a crosslinked silicone rubber layer having a coat weight of 2.5 g/m².

EXAMPLE 3

The negative working waterless printing plate of Example 2 was imagewise exposed to UV light of 160 mJ/cm² through a negative original in vacuo to solubilize the exposed areas. It was developed using a mixture solution of benzyl alcohol and tripropylene glycol-n-butyl ether (Dow Chemical) (weight ratio: 30/70) and rubbing (or using a mechanical processor equipped with rotating brush at 35–30° C. and a processing speed of 6.25 ft/min) to dissolve the solubilized imaging layer and to remove (or brush off) overlying silicone rubber layer. A good image resolution was obtained: 2%(highlights)/98%(shadows) on a 150 line/inch-screen. The exposed radiation-sensitive area produces ink receptive areas whereas the unexposed silicone rubber layer produces ink repellent background areas. The developed negative working waterless printing plate was mounted on compressible blanket sheet-fed Omcsa H-125 press (Roberts and Porter Inc.) and tested for length of run using water washable alkaline ink (Sun Chemical-Shark ink R-2965-72-1 black) without dampening water. The plate ran 130,000 impressions with clean background and good image resolution.

EXAMPLE 4

Part (A):

7.5 Parts of polyurethane powder (UR 42-Panchim), 2.2 parts of naphthoquinone-1,2-diazide-sulfonate of p-cresol formaldehyde resin-Posilux 2402-PCAS), 0. 14 parts of ethyl violet, and 0.06 parts of triazine-B (2,4-bis-(trichloromethyl)-6-(4'-methoxy-1'-naphthyl)-s-triazine) (available from PCAS) were dissolved in a mixture of 240 parts of 1-methoxy-2-propanol and 11 parts of ethanol. The resulting solution was coated on a brush grained aluminum substrate in the same manner as described in Example 1.

Part (B):

An imaging layer containing triazine-E (2,4-bis-(trichloromethyl)-6(4'-ethoxyethoxy-1'-naphthyl)-s-triazine) (available from PCAS) instead of triazine-B was prepared in the same manner as in Part (A).

Part (C):

An imaging layer containing 4-(phenylazo)-diphenyl amine dye instead of triazine-B was prepared in the same manner as described in Part (A). Upon 160 mJ/cm² imagewise UV exposure, the exposed area changed into a darker color but the color difference between exposed and unexposed areas was too small (print out density was 0.02) to recognize imaged area clearly and not suitable for practical use.

EXAMPLE 5

Onto the imaging layers of Example 4, Part (A) and Example 4, Part (B), the silicone rubber solution of Example 2 was spin coated to produce silicone rubber-coated imaging plates Example 5, Part (A) and Example 5, Part (B), each having a silicone rubber coat weight of 2.5 g/m² after drying at 130° C. for two minutes.

The solvent resistance tests of the silicone rubber-coated imaging plates 5 (A) and 5 (B) were carried out as follows:

A mixture of benzyl alcohol and tripropylene glycol-n-butyl ether (50/50 weight ratio) was applied to the surface of the unexposed silicone rubber layer to measure the time period requiring to start the dissolving of the coating. The time required for starting dissolution of the coating was:

Example 2 plate=73 seconds<Example 5, Part (B) plate=80 seconds<Example 5, Part (A) plate=90 seconds.

The silicone rubber layer coated waterless printing plates of Example 2, Example 5, Part (A) and Example 5, Part (B) were exposed to UV light of 160 mJ/cm² energy through the negative original. The colors of exposed areas of Example 5, Part (A) and Example 5, Part (B) were bleached and less intensively colored to give visible images and color differences (print out) between exposed and unexposed areas of these plates that were similar to each other (0.03 of print out). To provide visible images after exposure before development is very important from the practical aspect in the course of preparation of the printing plate for the press run.

Incorporation of triazine-B in imaging layer enhanced solvent resistance of the silicone rubber layer.

EXAMPLE 6

The negative waterless printing plates of Examples 2, and Example 5, Part (A) were aged for 14 days in the oven under conditions of 80% relative humidity and 40° C. The aged plates were imagewise exposed to the UV light of 160 mJ/cm² of energy and were developed in the same manner as described in Example 3. The developed plates provided good image quality (highlight/shadow %=2/98 on 150 line/inch-screen) without any reverse adhesion of silicone rubber layer from the imaging layer.

EXAMPLE 7

The negative waterless printing plate of Example 5, Part (A) was exposed to the UV light of 160 mJ/cm² energy and developed in the same manner described in Example 3. The developed plate was mounted onto the compressible blanket Omcsa H-125 press (Roberts and Porter Inc.) and tested for press life using K & M standard waterless ink (conventional acidic cyan ink). The plate of Example 5, Part (A) containing triazine-B in the imaging layer ran more than 100,000 impressions of clean background at 86° F. It showed a very slight wear at 130,000 impressions at 91° F. and less ink toning than the printing plate of Example 2.

EXAMPLE 8

Negative working, waterless plate precursors were prepared in the same manner as in Example 2, except that in formulation (A) vinyl functional silicone gum PS-255 (from United Chemical Technology) was used in place of silicone gum VGM-021. In formulation (B), PS-255 was used in place of VGM-021 and platinum divinyl tetramethyldisiloxane complex PC-075 (from United Chemical Technology) was used in placed of the platinum carbonyl catalyst SIP 6829.

The plate precursors of formulation (A) and formulation (B) were subjected to an accelerated aging protocol in a humidity chamber at 80% relative humidity and 40° C. for 7 days. The aged plates were exposed and developed as described in Example 3. In the case of formulation (B) the silicone layer was found to peel away from the underlying imaging layer following processing. In contrast, the processed plate of formulation (A), which uses the platinum carbonyl catalyst of the present invention, exhibited no evidence of peeling. This result is indicative of a more durable non-image area.

Comparison of formulation (A) and formulation (B) illustrates that superior results are obtained when platinum carbonyl catalyst SIP 6829, which is a catalyst according to the present invention, is used instead of the conventional platinum divinyl tetramethyldisiloxane complex PC-075.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. An-A precursor for making an imageable element, comprising:
   a sheet substrate;
   an imaging layer on the substrate; and
   a crosslinkable layer overlying the imaging layer and comprising a vinyl functional polysiloxane copolymer having a molecular weight of at least 1,000 g/mol, a hydrosiloxane compound, wherein said curing is catalyzed by and a platinum compound having at least one carbonyl ligand and at least one non-carbonyl ligand.

2. The precursor of claim 1, wherein the non-carbonyl ligand is selected from the group consisting of: a halogen, a phosphine, an ethylenically unsaturated compound and a combination thereof.

3. The precursor of claim 1, wherein the non-carbonyl ligand is an ethylenically unsaturated silicon compound.

4. The precursor of claim 3, wherein said ethylenically unsaturated silicon compound is selected from the group consisting of: a cyclic vinylsiloxane, a non-cyclic vinylsiloxane and a combination thereof.

5. The precursor of claim 3, wherein said ethylenically unsaturated silicon compound is selected from the group consisting of: 1,3-divinyl-1,1,3,3-tetramethyldisiloxane, 1,3,5-trimethyl-1,3,5-trivinylcyclotrisiloxane, 1,3,5,7-tetramethyl-1,3,5,7-tetravinyl-cyclotetrasiloxane and a combination thereof.

6. The precursor of claim 1, wherein said platinum compound is selected from the group consisting of: platinum (0)-carbonyl-1,3,5,7-tetramethyl-1,3,5,7-tetravinylcyclotetrasiloxane complex, dichloroplatinum(II) dicarbonyl and a mixture thereof.

7. The precursor of claim 1, wherein said imaging layer is capable of becoming more soluble upon irradiation.

8. The precursor of claim 1, wherein said imaging layer is capable of becoming less soluble upon irradiation.

9. The precursor of claim 1, wherein said imaging layer is capable of exhibiting increased adhesion to said silicone layer upon irradiation.

10. The precursor of claim 1, wherein said imaging layer is capable of exhibiting decreased adhesion to said silicone layer upon irradiation.

11. The precursor of claim 1, wherein said imaging layer comprises a diazido naphthoquinone ester or amide compound.

12. The precursor of claim 11, wherein the imaging layer further comprises a thermoplastic polyurethane.

13. The precursor of claim 12, wherein said thermoplastic polyurethane is the product of a reaction between a diol and one or more diisocyanates selected from the group consisting of: 2,4-tolylene diisocyanate, 2,6-tolylene diisocyanate, p-xylene diisocynate, m-xylene diisocyanate, 4,4'-diphenylmethane diisocyanate, 1,5-naphthalene diisocyanate, 3,3'-dimethylbiphenyl-4,4'-diisocyanate, hexamethylene diisocyanate, trimethylhexamethylene diisocyanate, isophorone diisocyanate, 4-4'-methylenebis (cyclohexyl isocyanate), methylcyclohexane-2,4-diisocyanate, methylcyclohexane-2,6-diisocyanate and 1,3-bis(isocyanatomethyl) cyclohexane.

14. The precursor of claim 13, wherein said diol comprises one or more compounds selected from the group consisting of: an allyl functional diol, ethylene glycol, polyethylene glycol, propylene glycol, polypropylene glycol, neopentyl glycol and a mixture thereof.

15. The precursor of claim 12, wherein said thermoplastic polyurethane has an allyl functionality.

16. The precursor of claim 11, wherein said diazido naphthaquinone ester or amide compound is a diazido naphthoquinone sulfonate of a phenolic material.

17. The precursor of claim 1, wherein said sheet substrate is an aluminum sheet.

18. The precursor of claim 1, further comprising a primer layer disposed between said substrate and said imaging layer.

19. The precursor of claim 18, wherein said primer layer has an ink receptive surface.

20. The precursor of claim 1, wherein the crosslinkable layer comprises a hydrosilylation reaction inhibitor.

21. The precursor of claim 20, wherein said hydrosilylation reaction inhibitor is 1,3,5,7-tetravinyl-1,3,5,7-tetramethylcyclotetrasiloxane.

22. The precursor of claim 1, wherein said vinyl functional polysiloxane copolymer in said crosslinked silicone polymer crosslinkable layer has a molecular weight of from about 50,000 to about 2,000,000 g/mol.

23. The precursor of claim 22, wherein said molecular weight is from about 400,000 to about 2,000,000 g/mol.

24. The precursor of claim 1, wherein said imaging layer is sensitive to electromagnetic radiation.

25. The precursor of claim 1, wherein the imaging layer comprises a photothermal converter.

26. The precursor of claim 25, wherein said photothermal converter is capable of converting electromagnetic radiation into heat.

27. The precursor of claim 26, wherein said electromagnetic radiation is selected from the group consisting of: infrared radiation, ultraviolet radiation and a combination thereof.

28. A method of producing an imaged element comprising the steps of:
   coating a substrate with an imaging layer;
   applying over the imaging layer a curable composition comprising a vinyl functional polysiloxane copolymer having a molecular weight of at least 1,000 g/mol, a hydrosiloxane compound, and a platinum compound having at least one carbonyl ligand and at least one non-carbonyl ligand; and
   curing the composition to produce a silicone layer comprising a crosslinked silicone polymer;
   imagewise exposing said imaging layer to radiation to form an imaged layer having exposed areas and unexposed areas; and
   applying a developer liquid to said imaged layer;
to produce an imaged element having ink receptive areas and ink repellent areas.

29. The method of claim 28, wherein said exposed areas of said imaged layer are selectively removed by said developer liquid along with overlying areas of said silicone layer.

30. The method of claim 28, wherein said radiation is selected from the group consisting of: thermal, ultraviolet and infrared radiation.

31. The method of claim 28, wherein said developer liquid is diluted with a non-developing liquid selected from the group consisting of an alcohol, a glycol, an aliphatic hydrocarbons and a combination thereof.

32. A crosslinkable composition comprising a vinyl functional polysiloxane copolymer having a molecular weight of at least 1,000 g/mol, a hydrosiloxane compound, and a platinum compound having at least one carbonyl ligand and at least one non-carbonyl ligand.

33. The crosslinkable composition of claim 32, wherein said at least one non-carbonyl ligand is selected from the group consisting of: a halogen, a phosphine, an ethylenically unsaturated compound and a combination thereof.

34. The crosslinkable composition of claim 33, wherein said platinum compound is selected from the group consisting of: platinum(0)carbonyl-1,3,5,7-tetramethyl-1,3,5,7-tetravinylcyclotetrasiloxane complex, dichloroplatinum(II) dicarbonyl and a combination thereof.

35. The crosslinked silicone polymer crosslinkable composition of claim 32, wherein said vinyl functional polysiloxane copolymer has a molecular weight of from about 50,000 to about 2,000,000 g/mol.

36. A method for making an imageable element, the imageable element comprising a sheet substrate, an imaging layer on the substrate, and a silicone layer overlying the imaging layer, the method comprising the steps of:
   coating a sheet substrate with an imaging layer;
   applying over the imaging layer a curable composition comprising a vinyl functional polysiloxane copolymer having a molecular weight of at least 1,000 g/mol, a hydrosiloxane compound, and a platinum compound having at least one carbonyl ligand and at least one non-carbonyl ligand; and
   curing the composition to produce a silicone layer comprising a crosslinked silicone polymer;
to yield the imageable element.

37. The method of claim 36, wherein the non-carbonyl ligand is selected from the group consisting of: a halogen, a phosphine, an ethylenically unsaturated compound and a combination thereof.

38. The method of claim 36, wherein the non-carbonyl ligand is an ethylenically unsaturated silicon compound.

39. The method of claim 38, wherein the ethylenically unsaturated silicon compound is selected from the group consisting of: a cyclic vinylsiloxane, a non-cyclic vinylsiloxane and a combination thereof.

40. The method of claim 38, wherein the ethylenically unsaturated silicon compound is selected from the group consisting of: 1,3-divinyl-1,1,3,3-tetramethyldisiloxane, 1,3,5-trimethyl-1,3,5-trivinylcyclotrisiloxane, 1,3,5,7-tetramethyl-1,3,5,7-tetravinyl-cyclotetrasiloxane and a combination thereof.

41. The method of claim 36, wherein the platinum compound is selected from the group consisting of: platinum(0)-carbonyl-1,3,5,7-tetramethyl-1,3,5,7-tetravinylcyclotetrasiloxane complex, dichloroplatinum(II) dicarbonyl and a mixture thereof.

42. The method of claim 36, wherein the curable composition further comprises a hydrosilylation reaction inhibitor.

43. The method of claim 42, wherein the hydrosilylation reaction inhibitor is 1,3,5,7-tetravinyl-1,3,5,7-tetramethylcyclotetrasiloxane.

44. The method of claim 36, wherein the vinyl functional polysiloxane copolymer has a molecular weight of from about 50,000 to about 2,000,000 g/mol.

45. The method of claim 44, wherein the molecular weight is from about 400,000 to about 2,000,000 g/mol.

46. An imageable element including a silicone layer exhibiting enhanced adhesion to a substrate, the imageable element comprising:

a sheet substrate;

an imaging layer on the substrate; and a crosslinked silicone layer overlying the imaging layer and comprising a platinum compound having at least one carbonyl ligand and at least one non-carbonyl ligand.

47. The imageable element of claim 46, wherein the crosslinked silicone layer is a curing product of a vinyl functional polysiloxane copolymer and a hydrosiloxane compound.

* * * * *

UNITED STATES PATENT AND TRADEMARK OFFICE
CERTIFICATE OF CORRECTION

PATENT NO.     : 6,656,661 B2
DATED          : December 2, 2003
INVENTOR(S)    : Suck-JU Hong et al.

It is certified that error appears in the above-identified patent and that said Letters Patent is hereby corrected as shown below:

Column 16,
Lines 27-28, delete the phrase "wherein said curing is catalyzed by"

Column 17,
Line 32, delete the word "crosslinked" and replace it with -- crosslinkable --
Lines 32-33, deleter the phrase "silicone polymer crosslinkable"
Line 56, delete the word "and"

Column 18,
Line 21, delete the word "crossinked" and replace it with -- crosslinkable --
Line 21, delete the phrase "silicone polymer crosslinkable"

Column 19,
Line 5, delete the phrase "to a substrate"

Signed and Sealed this

First Day of June, 2004

JON W. DUDAS
*Acting Director of the United States Patent and Trademark Office*